United States Patent
Loo et al.

(10) Patent No.: US 10,680,193 B2
(45) Date of Patent: Jun. 9, 2020

(54) PHOTOELECTRIC CELLS INCORPORATING WRINKLES AND FOLDS TO ENHANCE EFFICIENCY AND BENDABILITY AND METHOD OF MAKING

(71) Applicants: Yueh-Lin Loo, Princeton, NJ (US); Jongbok Kim, Princeton, NJ (US); Pilnam Kim, Daejeon (KR); Howard Stone, Princeton, NJ (US); Nicolas Pegard, Princeton, NJ (US); Jason Fleischer, Princeton, NJ (US)

(72) Inventors: Yueh-Lin Loo, Princeton, NJ (US); Jongbok Kim, Princeton, NJ (US); Pilnam Kim, Daejeon (KR); Howard Stone, Princeton, NJ (US); Nicolas Pegard, Princeton, NJ (US); Jason Fleischer, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 470 days.

(21) Appl. No.: 14/214,564

(22) Filed: Mar. 14, 2014

(65) Prior Publication Data
US 2014/0261675 A1    Sep. 18, 2014

Related U.S. Application Data

(60) Provisional application No. 61/781,463, filed on Mar. 14, 2013.

(51) Int. Cl.
*H01L 51/44* (2006.01)
*H01L 51/00* (2006.01)
*H01L 51/42* (2006.01)

(52) U.S. Cl.
CPC ........ *H01L 51/447* (2013.01); *H01L 51/0037* (2013.01); *H01L 51/0097* (2013.01); *H01L 51/4253* (2013.01); *Y02E 10/549* (2013.01)

(58) Field of Classification Search
CPC ............... H01L 51/447; H01L 51/0038; H01L 51/0097; H01L 51/4253
(Continued)

(56) References Cited

PUBLICATIONS

Azimi, Hamed, Mauro Morana, Tayebeh Ameri, Babak Dastmalchi, Markus Scharber, Kurt Hingerl, and Christoph J. Brabec. "Determining the Internal Quantum Efficiency of Organic Bulk Heterojunctions Based on Mono and Bis-adduct Fullerenes as Acceptor." Solar Energy Materials and Solar Cells 95.11 (2011): 3093-098.*

(Continued)

*Primary Examiner* — Magali P Slawski
*Assistant Examiner* — Kourtney R S Carlson
(74) *Attorney, Agent, or Firm* — Meagher Emanuel Laks Goldberg & Liao, LLP

(57) ABSTRACT

A photovoltaic cell and method of making are disclosed. The photovoltaic cell includes a substrate having a surface at least partially covered in wrinkles and folds, the folds dividing the surface into a plurality of domains. A photoactive layer is formed on the substrate. At least one transparent electrode is coupled to the photoactive layer and configured to allow transmission of light into the photoactive layer. The domains may have a wrinkle periodicity of less than 2 μm. The folds may have a fold density of less than 0.25. The transport layer may comprise PEDOT:PSS. The photoactive layer may comprise P3HT:PCBM. The photoactive layer may comprise a bulk heterojunction.

5 Claims, 11 Drawing Sheets

(58) Field of Classification Search
USPC .................................................. 136/242–265
See application file for complete search history.

(56) References Cited

PUBLICATIONS

"Buckle—Dictionary Definition." Vocabulary.com, Jul. 11, 2016. <https://www.vocabulary.com/dictionary/buckle>.*

Ned Bowden, et al. Spontaneous formation of ordered structures in thin films of metals supported on an elastomeric polymer: Nature, May 14, 1998, vol. 393, p. 146-149.

Fabian Brau, et al. Multiple-length-scale elastic instability mimics parametric resonance of nonlinear oscillators: Nature Physics, Jan. 2011, vol. 7, p. 56-60.

Kirill Efimenko, et al. Nested self-similar wrinkling patterns in skins: Nature Materials, Apr. 2005, vol. 4, p. 293-297.

Jan Genzer, et al. Soft matter with hard skin: From skin wrinkles to templating and material characterization: Soft Matter, 2006, vol. 2, p. 310-323.

Dahl-Young Khang, et al. A Stretchable Form of Single-Crystal Silicon for High-Performance Electronics on Rubber Substrates: Science, Jan. 13, 2006, vol. 311, p. 208-212.

Pilnam Kim, et al. Hierarchical folding of elastic membranes under biaxial compressive stress: Nature Materials, Dec. 2011, vol. 10, p. 952-957.

Won Hoe Koo, et al. Light extraction from organic light-emitting diodes enhanced by spontaneously formed buckles: Nature Photonics, Apr. 2010, vol. 4, p. 222-226.

Aline F. Miller. Exploiting Wrinkle Formation: Materials Science, Aug. 3, 2007, vol. 317, p. 605-606.

Luka Pocivavsek, et al. Stress and Fold Localization in Thin Elastic Membranes: Science, May 16, 2008, vol. 320, p. 912-916.

R. Scott Poethig. Leaf Morphogenesis in Flowering Plants: The Plant Cell, vol. 9, p. 1077-1087.

Seulkl Lee, et al. Polymeric Nanoparticle-Based Activatable Near-Infrared Nanosensor for Protease Determination In Vivo: Nano Letters, 2009, vol. 9, No. 12, p. 4412-4416.

Yugang Sun, et al. Controlled buckling of semiconductor nanoribbons for stretchable electronics: Nature Nanotechnology, Dec. 2006, vol. 1, p. 201-207.

Cunjiang Yu, et al. Stretchable Supercapacitors Based on Buckled Single-Walled Carbon Nanotube Macrofilms: Advanced Materials, 2009, vol. 21, p. 4793-4797.

* cited by examiner

PHOTOELECTRIC CELLS INCORPORATING WRINKLES AND FOLDS TO ENHANCE EFFICIENCY AND BENDABILITY AND METHOD OF MAKING

CROSS-REFERENCE TO PRIOR FILED APPLICATIONS

This application claims the benefit of U.S. Provisional Application No. 61/781,463, filed Mar. 14, 2013, which is incorporated herein in its entirety.

STATEMENT REGARDING FEDERALLY SPONSORED RESEARCH OR DEVELOPMENT

This invention was made with government support under Grant # DMR-0819860 awarded by the National Science Foundation and Grant # N00014-11-1-0328 awarded by the Office of Naval Research. The government has certain rights in this invention.

TECHNICAL FIELD

The present disclosure generally relates to photovoltaic cells and more particularly photovoltaic cells incorporating wrinkles and folds to enhance efficiency and bendability.

BACKGROUND OF THE INVENTION

Wrinkles form spontaneously and are commonly seen in nature (A. F. Miller, Science 317, 605 (2007); R. S. Poethig, Plant Cell, 9, 1077 (1997)). Many researchers have been studying this wrinkling phenomenon, resulting in the improvement of our understanding on wrinkle formation as well as making it possible to artificially generate and control wrinkles (J. Genzer, et. al., Soft Matter 2, 310 (2006); N. Bowden, et. al., Nature 393, 146 (1998); K. Efimenko, et. al., Nat. Mater. 4, 293 (2005); Y. Sun, et. al., Nat. Nanotechnol. 1, 201 (2006); S. Y. Ryu, et. al., Nano Lett. 9, 3214 (2009)). The application of wrinkles to electronics achieved dramatic progress; mechanically stretchable inorganic photodetector (Y. Sun, et. al., Nat. Nanotechnol. 1, 201 (2006)), flexible inorganic thin-film transistors (D. Y. Kang, et. al., Science 311, 208 (2006)) and inorganic capacitors (C. Yu, et. al., Adv. Mater. 21, 4793 (2009)) are amongst the devices realized today. Also, wrinkles have been shown to enhance light extraction efficiency in organic light-emitting diodes (W. H. Koo, Nat. Photonics 4, 222 (2010)). Devices incorporating wrinkled structures and having improved characteristics are desirable.

BRIEF SUMMARY OF THE INVENTION

A photovoltaic cell is disclosed. The photovoltaic cell includes a substrate having a surface at least partially covered in wrinkles and folds, the folds dividing the surface into a plurality of domains. A photoactive layer is formed on the substrate. At least one transparent electrode is coupled to the photoactive layer and configured to allow transmission of light into the photoactive layer. The domains may have a wrinkle periodicity of less than 2 µm. The folds may have a fold density of less than 0.25. The transport layer may comprise PEDOT:PSS. The photoactive layer may comprise P3HT:PCBM. The photoactive layer may comprise a bulk heterojunction. The bulk heterojunction may comprise Si-PCPDTBT:PCBM.

A method for producing a photovoltaic cell is also disclosed. The method includes forming an optical adhesive film having a surface at least partially covered in wrinkles and folds, the folds dividing the surface into a plurality of domains. A photoactive layer is formed on the optical adhesive film. At least one electrode is coupled to the photoactive layer. The domains may have a wrinkle periodicity of less than 2 µm. The folds may have a fold density of less than 0.25. The transport layer may comprise PEDOT:PSS. The photoactive layer may comprise P3HT:PCBM. The photoactive layer may comprise a bulk heterojunction. The bulk heterojunction may comprise Si-PCPDTBT:PCBM.

Another method for producing a photovoltaic cell is also disclosed. The method includes providing an optical adhesive film having a top surface and an underlayer. The top surface is cured differentially from the underlayer to create moduli differences. The elastic modulus of the top surface is controlled. The optical adhesive film is further cured generating a cured optical adhesive film having a top surface at least partially covered in wrinkles and folds, the folds dividing the surface into a plurality of domains. At least one photoactive layer is formed on the cured optical adhesive film. At least one electrode is formed on the photoactive layer. The domains may have a wrinkle periodicity of less than 2 µm. The folds may have a fold density of less than 0.25. The transport layer may comprise PEDOT:PSS. The photoactive layer may comprise P3HT:PCBM. The photoactive layer may comprise a bulk heterojunction. The bulk heterojunction may comprise Si-PCPDTBT:PCBM.

DETAILED DESCRIPTION OF THE INVENTION

Figure 1A:
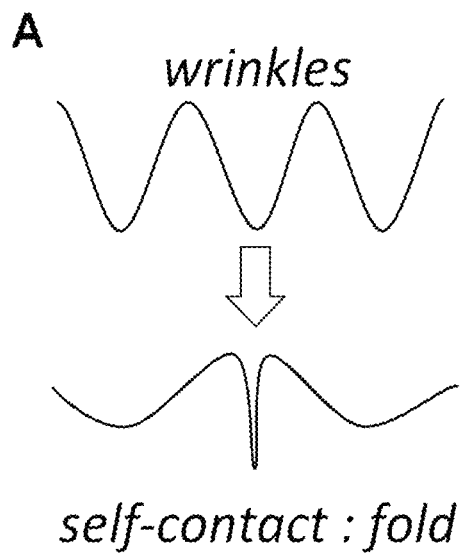
FIG. 1A is a schematic illustration of the wrinkle-to-fold transition.

The present disclosure generally relates to folds impacting light propagation and light harvesting with application in polymer photovoltaic or solar cells. The fold structures are fabricated by controlling biaxial compressive stress on optical adhesive films. While device performance on wrinkled surfaces is enhanced, with a 16% increase in power-conversion efficiency over those on flat surfaces, devices on surfaces having both wrinkles and folds (referred to as hybrid surfaces herein) have achieved a 40% improvement of power-conversion efficiency. This enhancement results from localization and circulation of incident light, which dramatically improve the light harvesting efficiency of the devices in the spectral range where the absorption coefficient of photoactive layer is high, as well as in regions where the absorption coefficient of photoactive layer is low.

Disclosed herein are a new process and devices formed using this process. The present disclosure generally relates to the incorporation of both wrinkles and folds to enhance the efficiency and bendability of plastic photovoltaic cells and the method to create such structures. This disclosure applies hybrid surfaces comprising wrinkles and folds into electronic devices. Simple integration of these versatile structures overcomes materials limits to improve power-conversion efficiency in polymer photovoltaic cells.

By imposing a large compressive biaxial stress on surfaces, one can induce non-linear elastic instability that causes the formation of wrinkles and folds whose amplitudes and periodicities can be precisely tuned through the administered stresses. Since these structures are on the same order of magnitude as visible light, they can increase light scattering. Further, the deep folds can act as light concentrators. These structures can thus enhance light harvesting when incorporated in opto-electronic devices. While wrinkles have been employed in various opto-electronic devices, folds have not. It has been discovered that the presence of folds—due to their light concentrating capability—can further improve organic photovoltaic cell device efficiencies by dramatically increasing light harvesting efficiency.

A 40% increase in polymer photovoltage cell efficiency has been demonstrated when devices are constructed on surfaces comprising wrinkles and folds, as opposed to devices constructed on flat surfaces. The presence of wrinkles and folds increase light propagation and light trapping, respectively, in the active layer of photovoltaic cells. Additionally, the presence of wrinkles and folds impart additional mechanical stability and robustness to our devices. While standard devices fail due to the fracture of the top electrode under bend tests, devices constructed on surfaces with wrinkles and folds maintain their performance, even after having undergone sustained bend tests.

These wrinkles and folds can be created on elastomeric substrates, and that polymer photovoltaic cells can be constructed atop these substrates. Unstrained, these wrinkles scatter light and these devices absorb light to generate electrical energy. When strained, the wrinkles are effectively straightened out. The absence of light scattering centers will convert the device stack from optically opaque to transparent. One can use such a platform to construct integrated photovoltaic cell arrays that produce electrical energy when the photon flux is high but can be strained to become transparent windows when the photon flux is low.

Folds are manifestations of non-linear elastic instability and as disclosed herein this can be exploited in electronic devices. The folds can trap and concentrate light effectively and can dramatically enhance the light harvesting efficiency of opto-electronic devices.

Figure 1B:
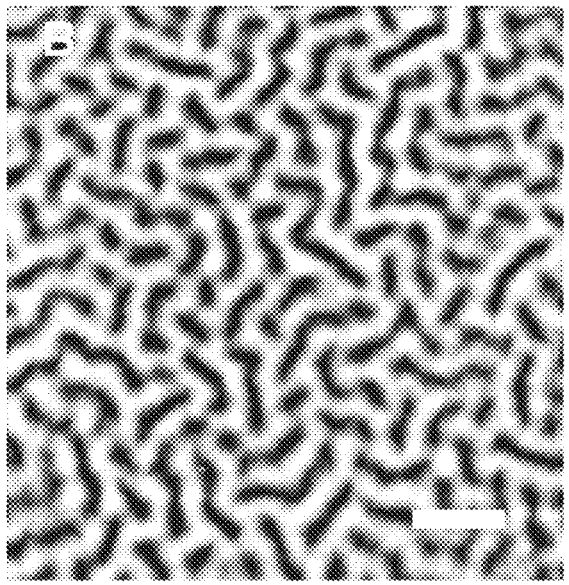
FIG. 1B is an illustration of the morphology of a wrinkled surface with wrinkle periodicity $(P_w)$=1.8 µm.
Figure 1C:
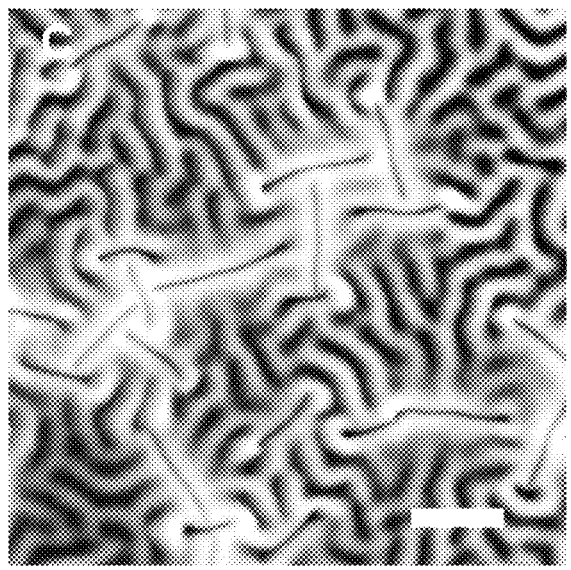
FIG. 1C is an illustration of the morphology of a hybrid surface with $P_w$=1.8 µm and fold density $(R_{fold})$=0.037.
Figure 1D:
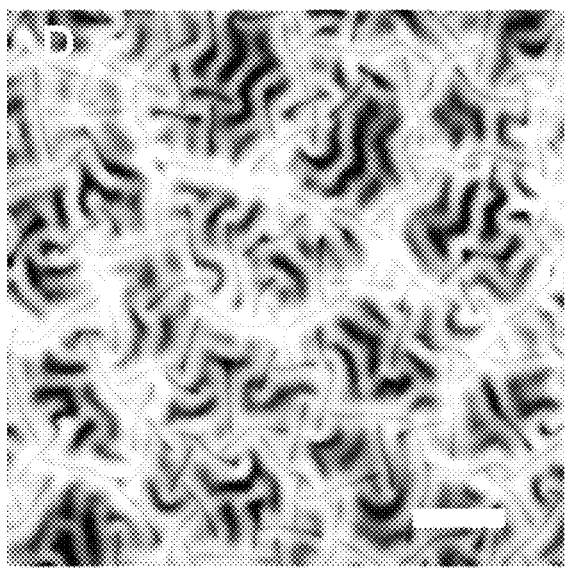
FIG. 1D is an illustration of the morphology of a hybrid surface with $P_w$=1.8 µm and $R_{fold}$=0.174.

As seen in FIG. 1A, when wrinkles are exposed to increasing compressive stress, they push against each other, finally generating folds to release stresses experienced by neighboring wrinkles. Because this distortion is limited to a narrow region of the wrinkled surface, the wrinkle-to-fold transition results in hybrid surfaces comprising both wrinkles and folds, whose fold density, $R_{fold}$, is adjustable through the amount of compressive stress. A visual illustration of the generation of an increasing number of domains encompassed by folds as compressive stress is increased can be seen in FIGS. 1B, 1C, and 1D, where 1B is under the least compressive stress and 1D is under the highest.

Generically, the process involves the creation of thin layers having different mechanical properties. This difference in mechanical properties in turn induces mechanical stresses that cause buckling of the surface, which ultimately results in wrinkles. Increasing the mechanical stress further extends the instability into nonlinear regime, resulting in the formation of deep folds. These wrinkles and folds are generated by a combination of UV-ozone and plasma treatments. One can also generate these instabilities using a number of different chemical and mechanical schemes. One can batch process to create such substrates, or employ another scheme conducive to serial processing to create appropriate wrinkles and folds.

Figure 2A:
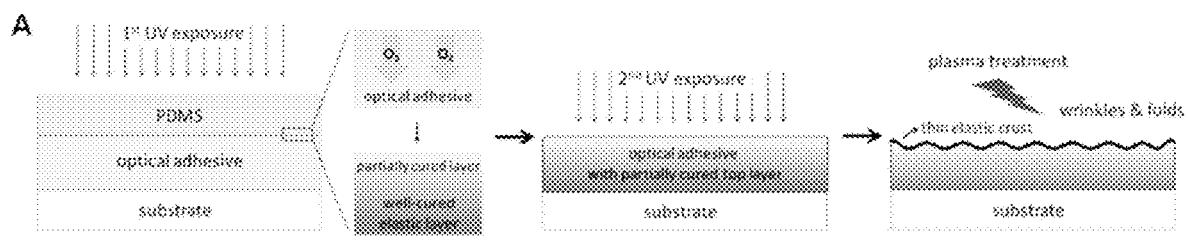
FIG. 2A is a schematic illustration of the procedure to generate wrinkles and hybrid surfaces on partially cured optical adhesive film.

FIG. 2A discloses an example approach for generating wrinkles and hybrid surfaces on partially cured optical adhesive film. In this example, after dispensing a drop of Norland Optical Adhesive (NOA 71) onto glass substrates, a poly(dimethylsiloxane), PDMS, flat stamp is brought into contact to yield a flat and uniform optical adhesive film that is ca. 20 μm thick; the film is exposed to ultra-violet light (315 nm-400 nm, at 72 W) through the flat PDMS stamp. Given that the NOA is in direct contact with PDMS, oxygen in PDMS partially suppresses curing of the top surface. This cures the top surface differentially from the underlayer layer to create moduli differences, ultimately resulting in an optical adhesive film with a partially cured layer atop a fully cured underlayer. To control the elastic modulus of the partially cured optical adhesive layer, $E_s$, the optical adhesive is subjected to a second ultra-violet irradiation in the absence of the PDMS stamp. Plasma treatment further cures the top surface of the partially cured layer, generating a thin rigid crust with thickness, h, and an elastic modulus, $E_f$. Ion penetration during plasma treatment simultaneously imposes an equibiaxial compressive stress within the thin rigid crust of the optical adhesive film, resulting in the generation of wrinkles whose wavelengths ($\lambda_W$ or $P_w$), can be predictively controlled by altering $E_s$, which can in turn be tuned through the second ultra-violet irradiation time, according to: $\lambda_W \sim 2\pi h \, (E_f/(3 \, E_s))^{1/3}$.

Figure 2B:
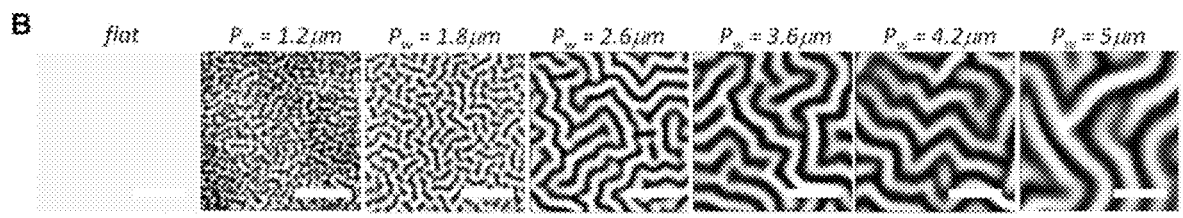
FIG. 2B is a series of atomic force microscope images illustrating the changes to the morphology of a surface as the $P_w$ increases from 0 to 5 µm.
Figure 2C:
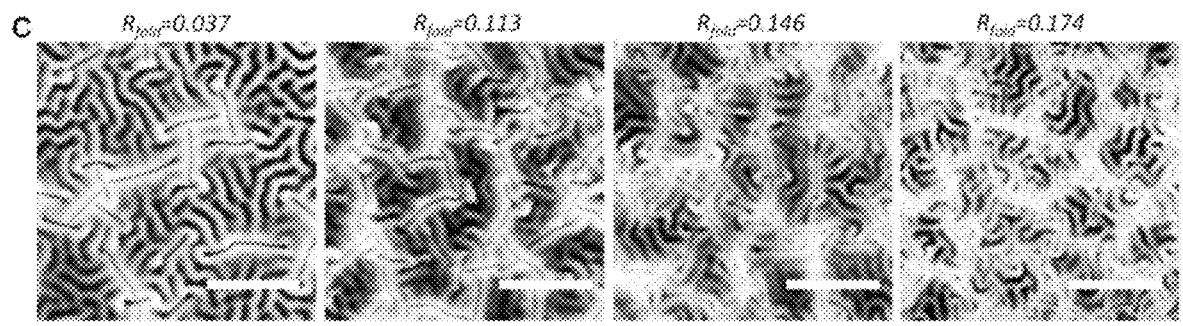
FIG. 2C is a series of atomic force microscope images illustrating the changes to the morphology of a surface with a $P_w$ of 1.8 µm as the fold density increases from 0.037 to 0.174.

Application of additional compressive stress via ion implantation by corona discharge or other approaches on the wrinkled surfaces induces self-contact of neighboring wrinkles and generates deep folds, ultimately resulting in a hybrid surface comprising both wrinkles and folds. Fold generation can be highly sensitive to the quality of corona discharge, which in turn is sensitive to environmental humidity. Experimentally, humidity levels greater than 20% have been required to generate folds. The quantity of folds generated, and, therefore, the number of domains of wrinkles encompassed by folds, can be increased by increasing the time the wrinkles are exposed to corona discharge. The quantity of folds is typically expressed as the fold density ($R_{fold}$), calculated by dividing the fold area by the total area. Exemplary films with wide ranges of $P_w$ values and $R_{fold}$ values have been created, as illustrated in FIGS. 2B and 2C. In FIG. 2B samples were created with $P_w$ values ranging from 1.2 μm to 5 μm. In FIG. 2C the samples were produced with $R_{fold}$ values ranging from 0.037 to 0.174, i.e., folds covering 3.7% to 17.4% of the total area. As shown in FIG. 2C, the folds divide the surface into a plurality of domains (each domain having wrinkles but no folds).

One or more photoactive layers such as those in polymer photovoltaic cell arrays can be constructed on these cured substrates. One approach involves first depositing of a 15-nm thick semi-transparent bottom gold electrode with a stencil mask by electron beam evaporation. Given that light should be transmitted into the photoactive layer, a transparent conductor should be used, this can include but is not limited to thin gold layers. After UV/Ozone treatment of the bottom gold electrode for 15 min, spin-coat poly (3,4-ethylenedioxythiophene):poly(styrene-sulfonate), PEDOT:PSS (Clevios P; HC Starck), at 2000 rpm for 120 s, to form a 140-nm thick hole transport layer. After annealing PEDOT:PSS on the bottom electrodes at 150° C. for 20 min, spin-coat a co-solution comprising poly(3-hexyl thiophene), P3HT (Merck Chemicals Ltd.), and [6,6]-phenyl-C61-butyric acid methyl ester, PCBM (Nano-C), at a mass ratio of 1:0.8 and a total mass concentration of 24 mg/mL in chlorobenzene, resulting in a 180-nm thick bulk-heterojunction active layer. The material stacks are then transferred into a nitrogen-filled box, where 60-nm thick aluminum electrodes are evaporated on the photoactive layer through a stencil mask. Thermal annealing of devices with aluminum electrodes completed the fabrication of conventional polymer photovoltaic cells.

The sample photovoltaic cells produced using the approach disclosed above were observed to exhibit a 40% improvement in the efficiency of devices constructed on these hybrid surfaces compared to those on flat surfaces. These devices are also substantially more mechanically robust compared to devices on flat surfaces as the wrinkles and folds can effectively relieve mechanical stresses imposed during bend tests.

The ability to strain the surfaces with wrinkles and folds may allow one to tune the periodicity and thereby the surface's light modulation, allowing for the construction of windows that can generate electrical energy whose opacity is tunable with strain. One can also deposit transparent metal oxide conductors atop these surfaces to create topographically conformal electrodes for various electronic applications.

Figure 3A:
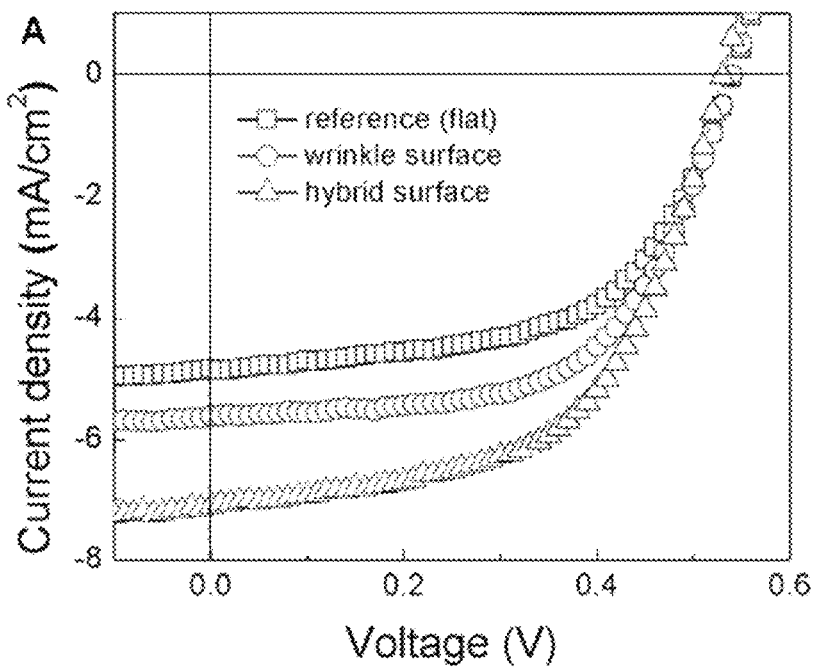
FIG. 3A is a graph illustrating representative current density-voltage characteristics of polymer photovoltaic or solar cells constructed on flat (squares), wrinkled (circles) and hybrid surfaces (diamonds)
Figure 3B:
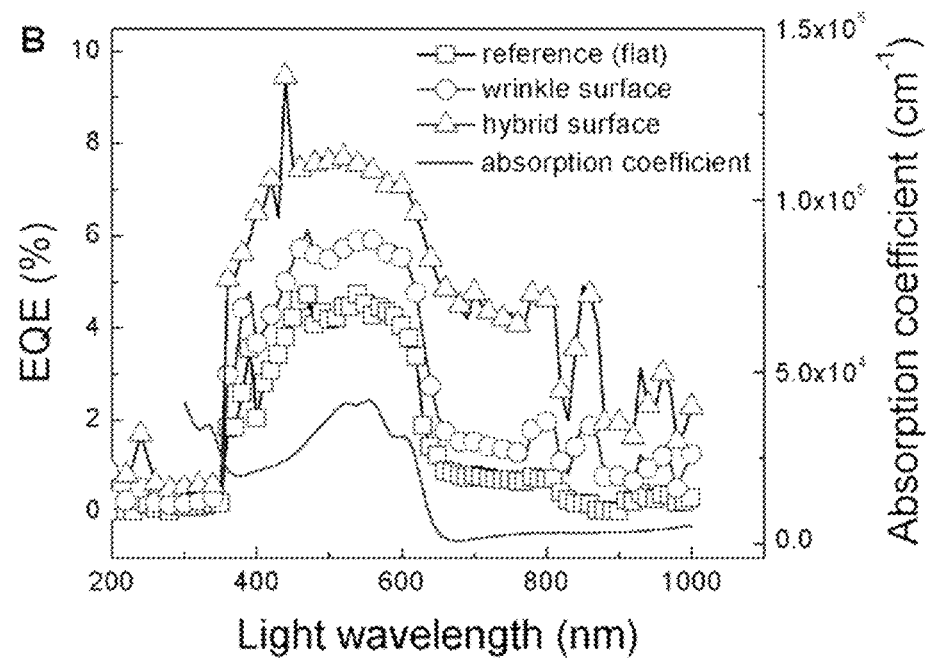
FIG. 3B is a graph illustrating representative external quantum efficiencies of polymer photovoltaic cells constructed on flat (squares), wrinkled (circles) and hybrid surfaces (diamonds), as well as the absorption coefficient of a P3HT:PCBM photoactive layer.
Figure 3C:
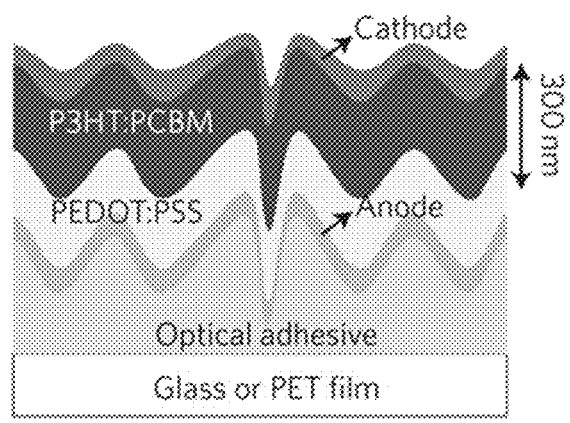
FIG. 3C is a diagram illustrating an exemplary device structure.

A schematic diagram of a photovoltaic cell on a wrinkled and hybrid surface is seen in FIG. 3C. An exemplary photoelectric cell consists of four layers: (1) an anode layer, such as indium tin oxide (ITO), (2) a hole transport layer, such as a poly(3,4-ethylenedioxythiophene) and poly(styrenesulfonate) blend (PEDOT:PSS), (3) a photoactive layer, such as a poly(3-hexylthiophene) and [6,6]-phenyl C61-butyric acid methylester blend (P3HT:PCBM) or bulk heterojunction comprising poly[(4,4'-bis(2-ethylhexyl)dithiene [3,2-b:2',3'-d]silole)-2,6-diyl-alt-(4,7-bis(2-thienyl)-2,1,3-benz-othiadiazole)-5,5'-diyl] (Si-PCPDTBT) and PCBM, and (4) a cathode layer, such as Aluminum (Al).

FIG. 3A discloses current density-voltage (J-V) characteristics of polymer photovoltaic cells constructed on flat, wrinkled and hybrid surfaces. While all devices have comparable open-circuit voltage ($V_{oc}$), the short-circuit current density ($J_{sc}$) is strongly dependent on the physical structures of the substrates. Devices on wrinkled surfaces exhibit a $J_{sc}$ increase of 13%, resulting in 16% enhancement in power-conversion efficiency compared to devices on flat surfaces. Devices on hybrid surfaces substrates exhibit a $J_{sc}$ increase of 47%, achieving 40% enhancement of efficiency over devices constructed on flat surfaces.

FIG. 3B discloses external quantum efficiency (EQE) of polymer photovoltaic cells constructed on flat, wrinkled and hybrid surfaces. Because light absorption in the active layer is responsible for photocurrent generation, the EQE spectra of the polymer photoelectric cells should mirror the shape of the absorption spectrum of P3HT:PCBM. Indeed, a sharp drop in the EQE spectra of the devices on flat and wrinkled surfaces is observed beyond 650 nm, reflecting limited current generation in our devices beyond the absorption edge of P3HT:PCBM. Comparison of the spectra indicates a modest increase (30%) in current generation for the polymer photovoltaic cell on wrinkled surfaces compared to that on flat surfaces. This increase in photocurrent generation is uniform across the range of wavelengths explored. The EQE spectrum of devices constructed on composite surfaces is higher yet; with a 79% increase in the average EQE in the visible of the solar spectrum as compared with devices on flat surfaces. Surprisingly, a dramatic increase is seen in EQE, by more than 600%, beyond the absorption edge of P3HT:PCBM (>650 nm) that is not observed in devices on wrinkled or flat surfaces. Photocurrent generation beyond the absorption edge of P3HT:PCBM is likely to stem from direct excitation of charge-transfer complexes or tail states of the constituent organic semiconductors that extend into the energy gap upon illumination, though both absorptions are known to be weak.

Figure 4A:
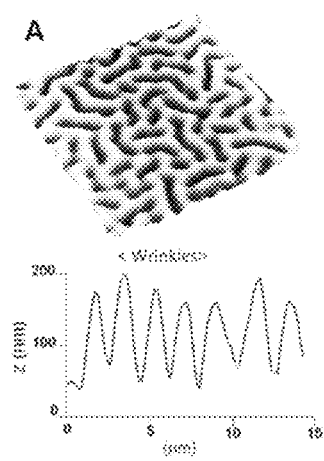
FIG. 4A is an 3-D illustration of the morphology of a wrinkled surface with a $P_w$=1.8 µm, and a graph illustrating a 1-D scan of that wrinkled surface.
Figure 4B:
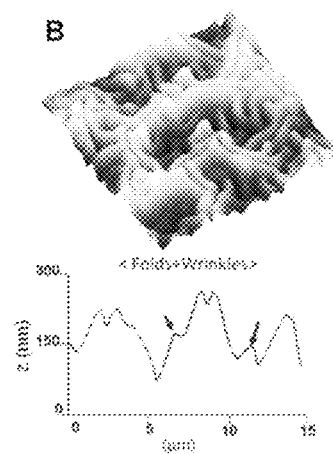
FIG. 4B is an 3-D illustration of the morphology of a hybrid surface with a $P_w=1.8$ μm and $R_{fold}=0.113$, and a graph illustrating a 1-D scan of that hybrid surface.
Figure 4C:
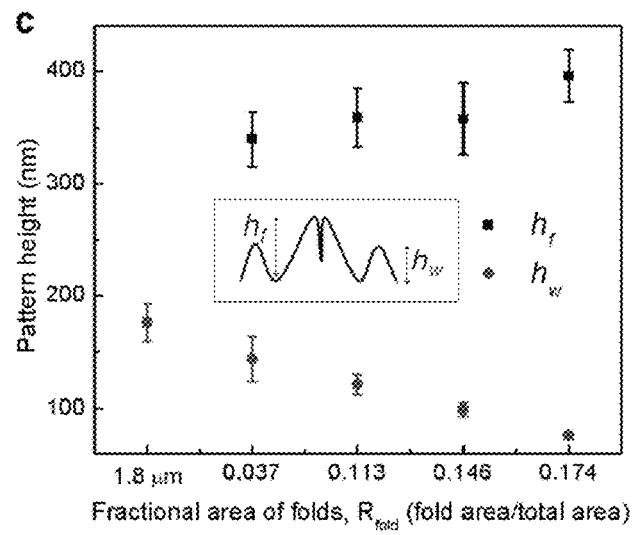
FIG. 4C is a graph illustrating the height variation of wrinkles ($h_w$) and folds ($h_f$) depending on fold density.
Figure 4D:
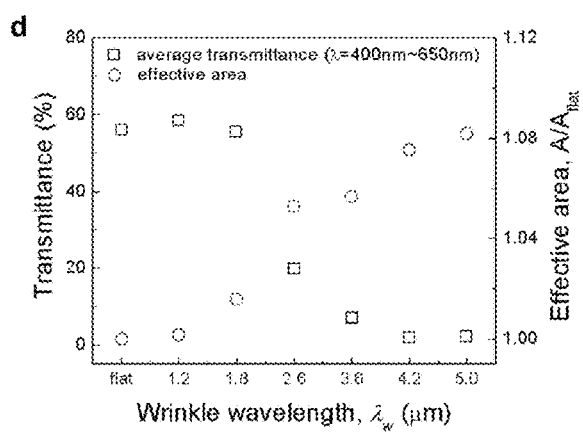
FIG. 4D is a graph illustrating the average transmittance and effective area due to the presence of wrinkles.
Figure 4E:
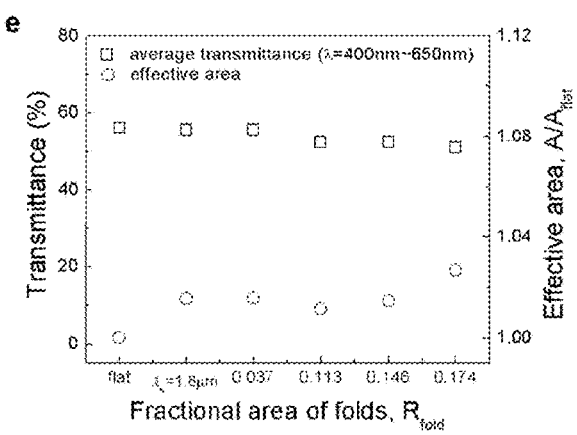
FIG. 4E is a graph illustrating the average transmittance and effective area due to the presence of wrinkles and folds.

FIGS. 4A and 4B disclose the morphological characterization of wrinkles and hybrid surfaces. While the surfaces with wrinkles have a single periodicity and uniform height distribution, hybrid surfaces comprise both wrinkles and folds. Also, FIG. 4C indicates that the average height of wrinkles becomes smaller with increasing fold density, although the wavelength remains constant. Folds have a significant impact on transmittance, as seen in FIGS. 4D and 4E. While wrinkles with periodicity below ~2 μm have comparable transmittance, the transmittance rapidly decreases when the periodicity is greater than 2 μm. However, hybrid surfaces with comparable wrinkle periodicity show comparable transmittance regardless of fold density.

Device performance can be compared by examining the J-V characteristics of the polymer photovoltaic cells constructed on various wrinkles and hybrid surfaces. While light scattering and trapping in devices on wrinkled surfaces having $P_w$<2 μm increases device performance, low transmittance of surfaces having $P_w$>2 μm decreases device performance. In the case of hybrid surfaces, devices constructed on surfaces having $R_{fold}$ around 0.113 and $P_w$ around 1.8 μm show the best device performance.

Figures 10A, 10B, 10C:
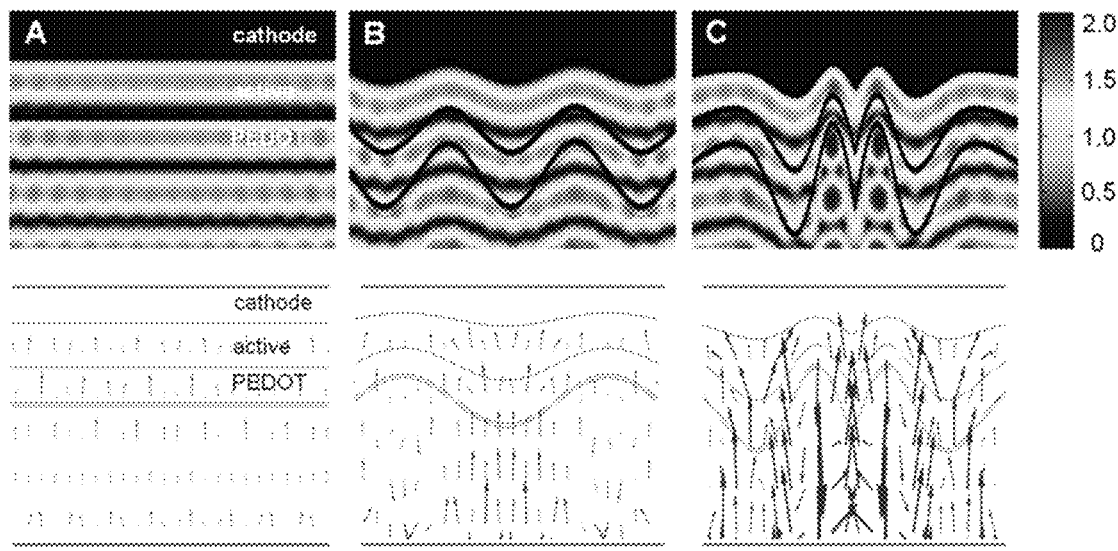
FIG. 10A is an illustration of a simulated light intensity profiles and Poynting vector diagrams for polymer photovoltaic cells constructed on a flat surface under illumination with 488-nm light.
FIG. 10B is an illustration of a simulated light intensity profiles and Poynting vector diagrams for polymer photovoltaic cells constructed on a wrinkled surface having a $P_w=1.8$ μm under 488 nm illumination.
FIG. 10C is an illustration of a simulated light intensity profiles and Poynting vector diagrams for polymer photovoltaic cells constructed on a hybrid surface having a $P_w=1.8$ μm and $R_{fold}=0.113$ under 488 nm illumination.
Figures 10D, 10E, 10F:
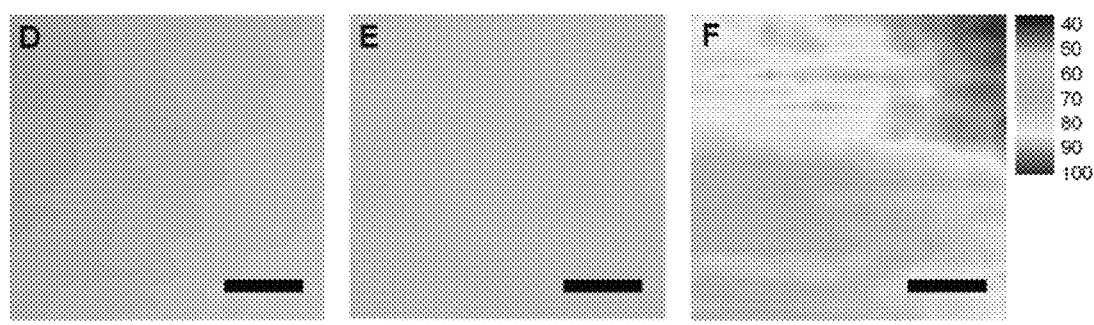
FIG. 10D is an illustration of photocurrents in polymer cells constructed on a flat surface under 488 nm illumination.
FIG. 10E is an illustration of photocurrents in polymer cells constructed on a wrinkled surface having a $P_w=1.8$ μm under 488 nm illumination.
FIG. 10F is an illustration of photocurrents in polymer cells constructed on a hybrid surface having a $P_w=1.8$ μm and $R_{fold}=0.113$ under 488 nm illumination.

FIGS. 10A-10C disclose simulations of light intensity profiles and Poynting vector diagrams for exemplary polymer photovoltaic cells constructed on flat, wrinkled and hybrid surfaces under 488 nm illumination, the wavelength corresponding to P3HT:PCBM's peak absorptivity. While wrinkles induce modest light incoupling, the hybrid surfaces localize and circulate incident light, significantly enhancing light harvesting efficiency. FIGS. 10D-10F further disclose local photocurrent mapping. Devices on flat surfaces show uniformly low photocurrent. Devices on wrinkled surface show uniform but enhanced photocurrent. Devices on hybrid surface exhibit regions of high photocurrent, corresponding to domain boundaries defined by the presence of folds in the atomic force microscope images of the hybrid surfaces. Combining simulations and local photocurrent experiments demonstrates that folds circulate incident light and enhance the light harvesting efficiency.

Based on the observed EQE enhancement, it is estimated that 69% of the incident 488-nm light is absorbed in the active layer of an exemplary device, corresponding to an effective optical path of 280 nm. The introduction of folds further increases the probability of light absorption in the active layer. The EQE enhancement for devices constructed on such surfaces relative to those on flat surfaces suggests an effective optical path that is four times greater (720 nm), corresponding to >95% light absorption. While impressive, this improvement in light absorption is less than a factor of two greater than devices on flat surfaces, since the absorption of 488-nm light by P3HT:PCBM is relatively efficient.

An improved result can been seen in FIGS. 9A-9F, which discloses simulated light intensity profiles, Poynting vector diagrams and local photocurrents of exemplary polymer photoelectric cells constructed on flat, wrinkled and hybrid surfaces under 750 nm illumination, a wavelength beyond P3HT:PCBM's absorption edge. Devices on wrinkled and hybrid surfaces show better light harvesting than that on flat substrates. At this wavelength, the low absorptivity of P3HT:PCBM means that device geometry can have a more dramatic effect on light absorption. In the baseline case of an exemplary flat device (FIG. 9A), it is estimated that <4% of 750-nm incident light is absorbed in the active layer. With the introduction of wrinkles and folds (FIGS. 9B and 9C), waveguiding becomes substantially stronger, significantly localizing and trapping light. Based on the EQE enhancements at 750 nm, it is estimated that the effective optical path increases in these exemplary devices from 180 nm in the flat device to 360 nm in the presence of wrinkles and to 1.2 μm in the device with folds. Correspondingly, the absorption of 750-nm light increases from <4% to 7% in the presence of wrinkles, and to 22% with the composite surface.

Figure 5A:
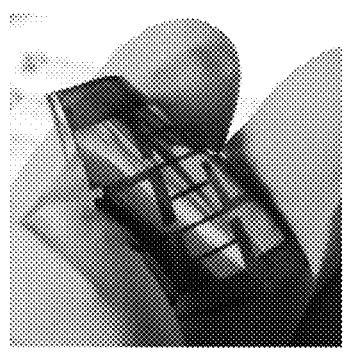
FIG. 5A is an illustration of a flexible polymer photoelectric cell being bent.
Figure 5B:
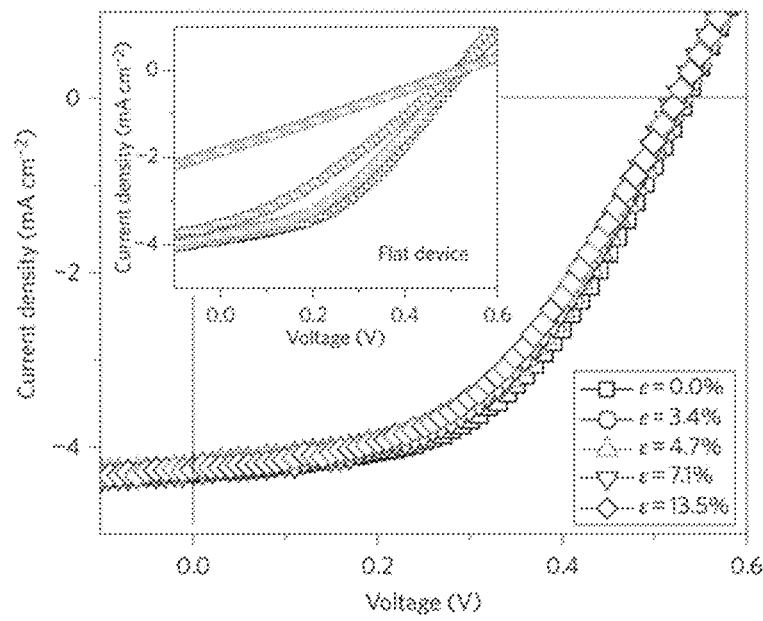
FIG. 5B is a graph illustrating J-V characteristics of a flexible photoelectric cell with wrinkles having a $P_w=1.8$ μm, depending on device bending.
Figure 5C:
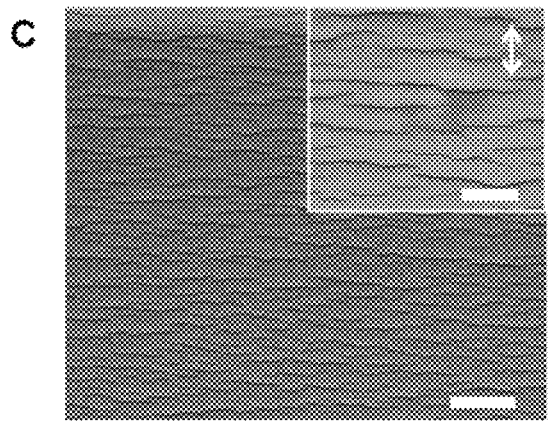
FIG. 5C is an illustration of an aluminum cathode of a device constructed on a flat surface after bending.
Figure 5D:
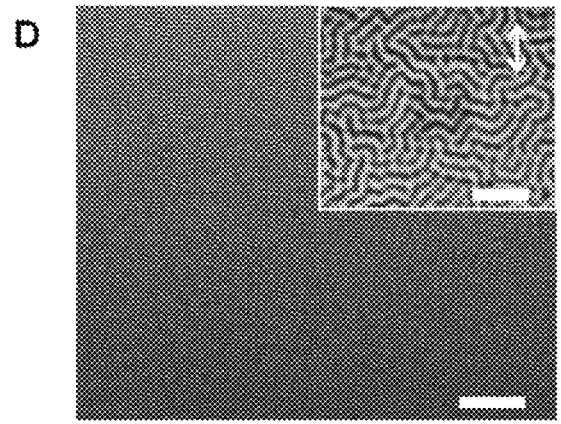
FIG. 5D is an illustration of an aluminum cathode of a device constructed on a wrinkled substrate ($P_w=1.8$ μm) after bending.
Figure 6A:
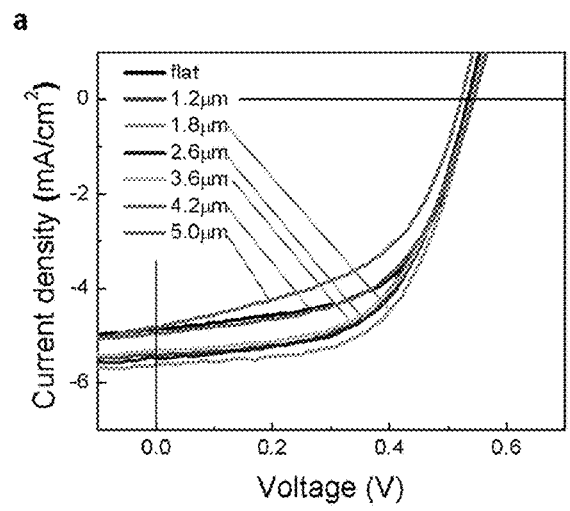
FIG. 6A is a graph illustrating current density-voltage characteristics of polymer photovoltaic cells with different wrinkle periodicities.
Figure 6B:
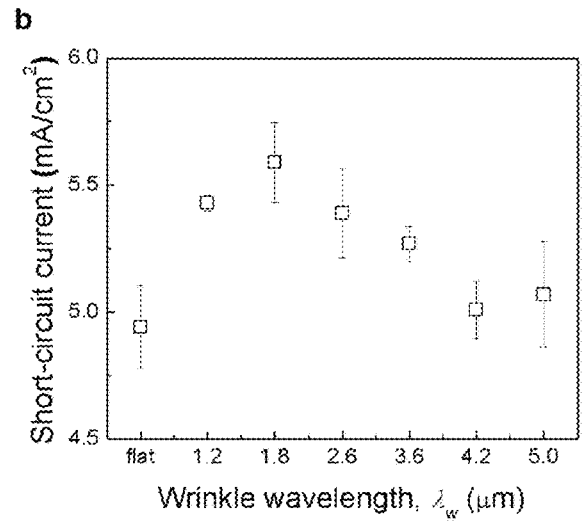
FIG. 6B is a graph illustrating extracted short-circuit densities of polymer photovoltaic cells with different wrinkle periodicities.
Figure 6C:
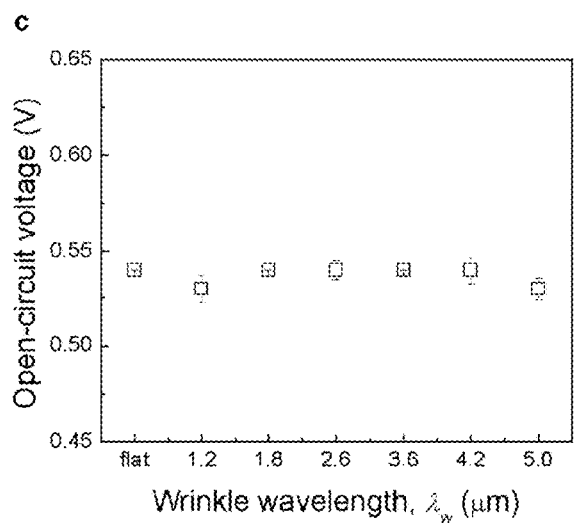
FIG. 6C is a graph illustrating open-circuit voltages of polymer photovoltaic cells with different wrinkle periodicities.
Figure 6D:
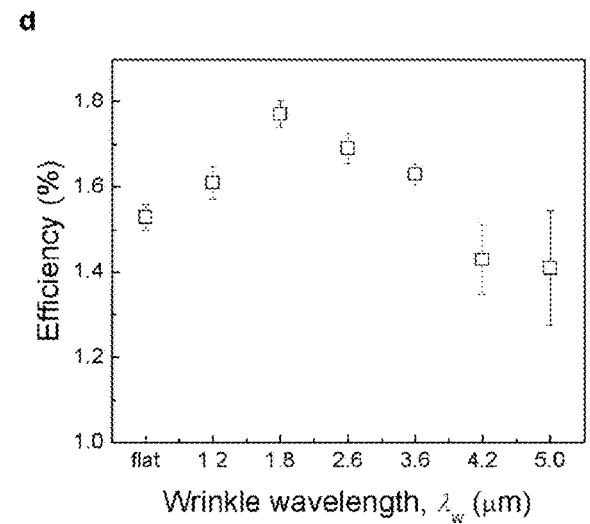
FIG. 6D is a graph illustrating power conversion efficiencies of polymer photovoltaic cells with different wrinkle periodicities.
Figure 7A:
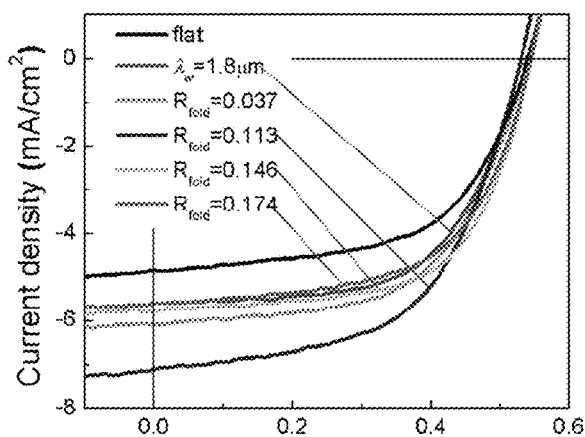
FIG. 7A is a graph illustrating current density-voltage characteristics of polymer photovoltaic cells with different fold densities and a $P_w=1.8$ μm.
Figure 7B:
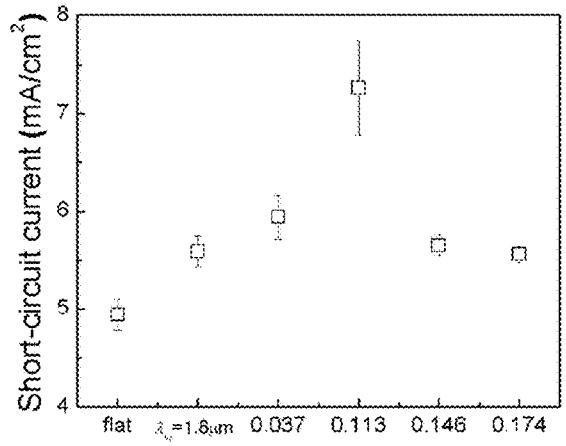
FIG. 7B is a graph illustrating extracted short-circuit densities of polymer photovoltaic cells with different fold densities and a $P_w=1.8$ μm.
Figure 7C:
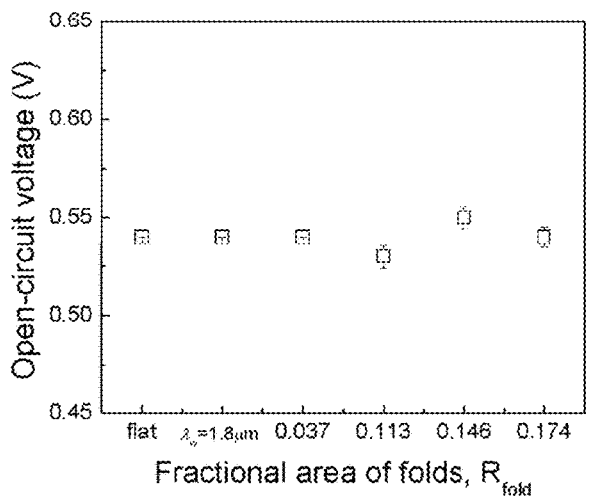
FIG. 7C is a graph illustrating open-circuit voltages of polymer photovoltaic cells with different fold densities and a $P_w=1.8$ μm.
Figure 7D:
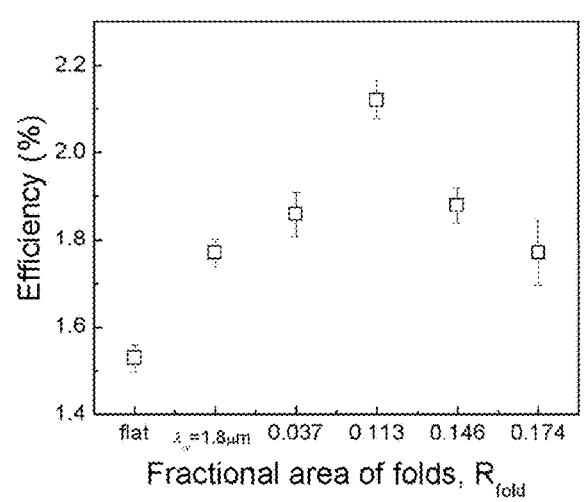
FIG. 7D is a graph illustrating power conversion efficiencies of polymer photovoltaic cells with different fold densities and a $P_w=1.8$ μm.

Exemplary devices also show a higher tolerance of flexing and bending under a mechanical bend test, as illustrated in FIG. 5B, which discloses J-V characteristics depending on device bending. The degree of bending is indicated by the strain (ε), which is approximated through the formula:

$$\varepsilon = \frac{t}{2r},$$

where t is the thickness of the photovoltaic cell and r is the radius of curvature, and expressing this value as a percentage. Wrinkles provide tolerance to mechanical stress on polymer photoelectric cells. Contrary to devices on flat surfaces, which see up to a 70% drop in power-conversion efficiency after device bending, devices on wrinkled surfaces exhibit comparable J-V characteristics regardless of device bending. This is seen in FIGS. 5C and 5D, which disclose scanning electron microscope (SEM) images of devices in the absence and presence of wrinkles after device bending: While bending the devices on flat surfaces generates cracks (5C), devices constructed on wrinkles (5D) maintain their original surface morphology regardless of device bending.

Figure 8A:
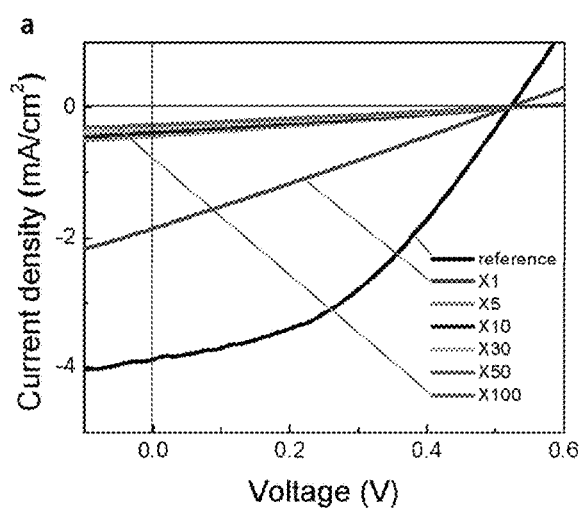
FIG. 8A is an illustration of current density-voltage characteristics of polymer photovoltaic cells on plastic substrates in the absence of wrinkles depending on the frequency of bending at ε=13.5%.
Figure 8B:
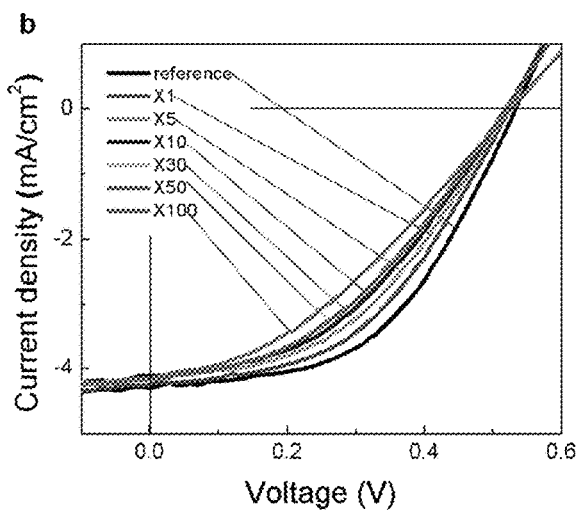
FIG. 8B is an illustration of current density-voltage characteristics of polymer photovoltaic cells on plastic substrates in the presence of wrinkles depending on the frequency of bending at ε=13.5%.
Figures 9A, 9B, 9C:
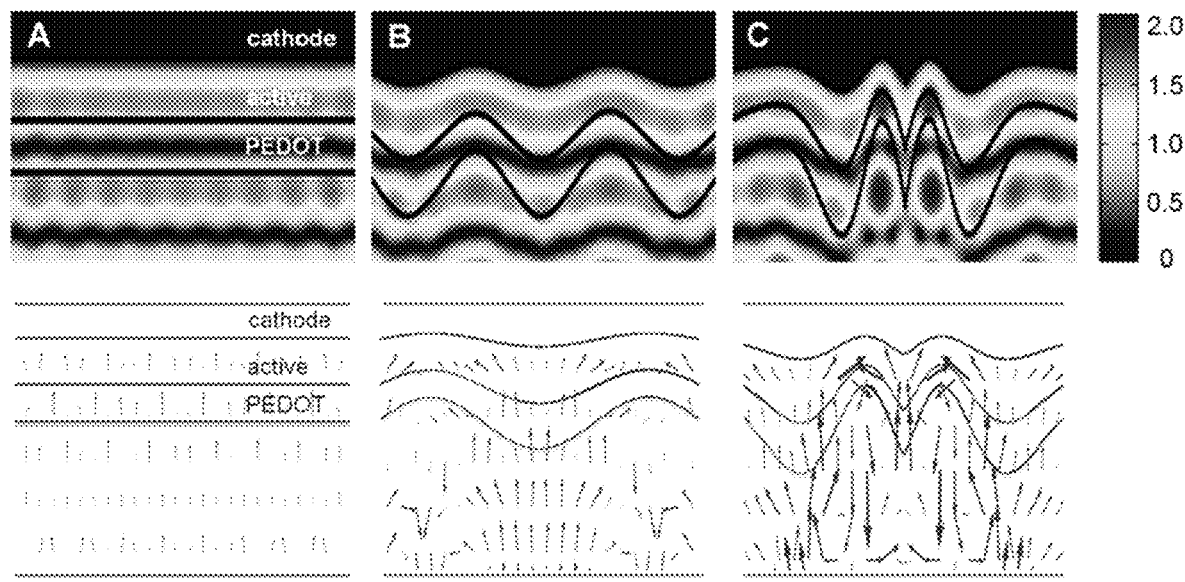
FIG. 9A is an illustration of a simulated light intensity profiles and Poynting vector diagrams for polymer photovoltaic cells constructed on a flat surface under illumination with 750-nm light.
FIG. 9B is an illustration of a simulated light intensity profiles and Poynting vector diagrams for polymer photovoltaic cells constructed on a wrinkled surface having a $P_w=1.8$ μm under 750 nm illumination.
FIG. 9C is an illustration of a simulated light intensity profiles and Poynting vector diagrams for polymer photovoltaic cells constructed on a hybrid surface having a $P_w=1.8$ μm and $R_{fold}=0.113$ under 750 nm illumination.
Figures 9D, 9E, 9F:
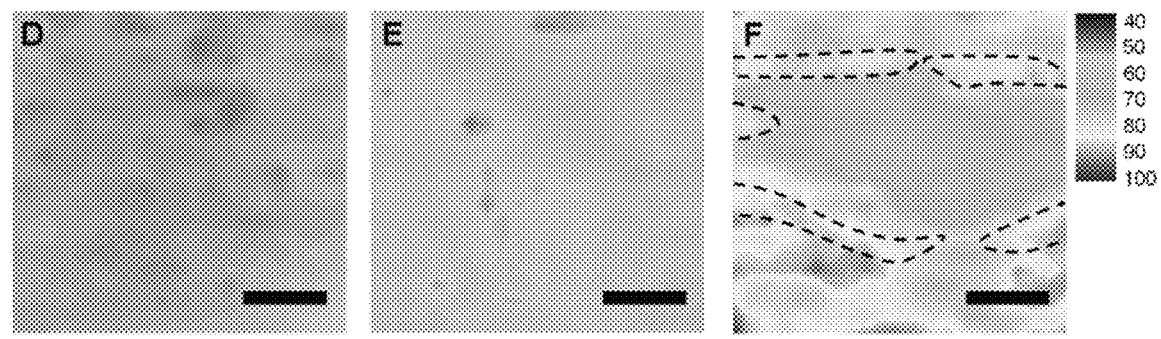
FIG. 9D is an illustration of photocurrents in polymer cells constructed on a flat surface under 750 nm illumination.
FIG. 9E is an illustration of photocurrents in polymer cells constructed on a wrinkled surface having a $P_w=1.8$ μm under 750 nm illumination.
FIG. 9F is an illustration of photocurrents in polymer cells constructed on a hybrid surface having a $P_w=1.8$ μm and $R_{fold}=0.113$ under 750 nm illumination.

FIG. 8A indicates current-density voltage characteristics of a device constructed on a flat surface as a strain of 13.5% is placed on the device one hundred times. FIG. 8B provides a similar graph for a device constructed on a wrinkled surface. As the graphs indicate, repeated flexing or bending of a photoelectric cell constructed on a flat surface continues to severely degrade device performance, while repeated bending of a flexible photoelectric cell on a wrinkled surface show relatively little degradation of device performance.

In conclusion, disclosed herein are photovoltaic cells exhibiting both wrinkles and folds. Improved J-V characteristics were observed, with a 600% increase in external quantum efficiency in the near-infrared region. The useful range of photocurrent collection was observed as extending more than 200 nm beyond the absorption edge of the photoactive material.

The references listed herein are also part of the application and are incorporated by reference in their entirety as if fully set forth herein including Kim et al. "Wrinkles and deep folds as photonic structures in photovoltaics" Nature Photonics 6, 327-332 (2012). It should be understood that many variations are possible based on the disclosure herein. Although features and elements are described above in particular combinations, each feature or element can be used alone without the other features and elements or in various combinations with or without other features and elements.

What is claimed is:

1. A photovoltaic cell, comprising:
    a substrate having disposed thereon a cured optical adhesive layer forming a surface at least partially covered in wrinkles and folds, the folds dividing the surface into a plurality of domains, the wrinkles and folds configured for trapping and concentrating light, the wrinkles being formed by a compressive stress imparted to the surface by partially suppressing curing of a top layer of the optical adhesive layer while providing a first ultra-violet curing of the optical adhesive layer, providing for a predefined time period a second ultra-violet curing of the optical adhesive layer to provide a partially cured optical adhesive layer having a desired elastic modulus Es associated with a desired wrinkle periodicity, and providing a plasma treatment curing of the optical adhesive layer to provide thereby a wrinkled surface, the folds being formed at a desired fold density by compressive stress applied to the wrinkled surface;
    a photoactive layer formed on the wrinkles and folds of the surface of the substrate, wherein the domains have a wrinkle periodicity of less than 2 μm, and the folds have a fold density of less than 0.25 of fold area per total area of the substrate; and
    at least one transparent electrode coupled to the photoactive layer and configured to allow transmission of light into the photoactive layer.

2. The photovoltaic cell of claim 1, further comprising a transport layer, wherein the transport layer comprises PEDOT:PSS.

3. The photovoltaic cell of claim 1, wherein the photoactive layer comprises P3HT:PCBM.

4. The photovoltaic cell of claim 1, wherein the photoactive layer comprises a bulk heterojunction.

5. The photovoltaic cell of claim 4, wherein the bulk heterojunction comprises Si-PCPDTBT:PCBM.

\* \* \* \* \*